(12) United States Patent
Adan

(10) Patent No.: US 6,175,131 B1
(45) Date of Patent: Jan. 16, 2001

(54) SEMICONDUCTOR DEVICE HAVING A CAPACITOR AND AN INTERCONNECT LAYER

(75) Inventor: Alberto Oscar Adan, Ikoma (JP)

(73) Assignee: Sharp Kabushiki Kaisha, Osaka (JP)

(*) Notice: Under 35 U.S.C. 154(b), the term of this patent shall be extended for 0 days.

(21) Appl. No.: 09/372,090

(22) Filed: Aug. 11, 1999

(30) Foreign Application Priority Data

Sep. 22, 1998 (JP) .................................. 10-268103

(51) Int. Cl.[7] .................... H01L 27/108; H01L 29/76; H01L 29/94
(52) U.S. Cl. ................................ 257/306; 257/532
(58) Field of Search ...................... 257/306, 532

(56) References Cited

U.S. PATENT DOCUMENTS 4,481,283 * 11/1984 Kerr et al. ..
4,754,313 * 6/1988 Takemae et al. ..
5,399,890 * 3/1995 Okada et al. ..

FOREIGN PATENT DOCUMENTS 5-129522   5/1993   (JP) .
8-274172   10/1996  (JP) .

* cited by examiner

Primary Examiner—Stephen D. Meier
(74) Attorney, Agent, or Firm—Nixon & Vanderhye P.C.

(57) ABSTRACT

A semiconductor device includes a capacitor and an interconnect layer disposed on a semiconductor substrate. The capacitor is formed of a bottom electrode, a capacitor dielectric film and a top electrode. The layer is formed of a first interconnect layer and a second layer laminated on the first layer. The bottom electrode and the first layer are formed of a first metal layer. The top electrode and the second layer are formed of a second metal layer. The capacitor dielectric film is formed only on the bottom electrode.

16 Claims, 3 Drawing Sheets

SEMICONDUCTOR DEVICE HAVING A CAPACITOR AND AN INTERCONNECT LAYER

CROSS-REFERENCES TO RELATED APPLICATIONS

This application is related to Japanese patent application No. HEI 10(1998)-268103 filed on Sep. 22, 1998 whose priority is claimed under 35 USC § 119, the disclosure of which is incorporated herein by reference in its entirety.

BACKGROUND OF THE INVENTION

1. Field of the Invention

The present invention relates to a semiconductor device and a manufacturing method thereof, and more particularly to a semiconductor device including a metal/metal-capacitor having a capacitance value which is not dependent on an applied voltage, and being formed of the same material and by the same process as a laminated film constituting an interconnect layer, and a method for manufacturing the semiconductor device.

2. Description of the Related Art

In recent years, capacitors having various structures are used in highly integrated circuits. For example, there are known a capacitor having a structure such that a dielectric film is sandwiched between a diffusion region formed in a semiconductor substrate and a polysilicon electrode formed on the substrate, a capacitor having a structure such that a dielectric film is sandwiched between top and bottom polysilicon electrodes, and a capacitor having a structure such that a dielectric film is sandwiched between top and bottom metal electrodes.

Among these capacitors, a capacitor constituting an analogue circuit determines a magnitude of an output signal, so that variation in the capacitance value of the capacitor causes variation in the output signal. Therefore, an A-D/D-A converter for example is desired to have a capacitor structure with a negligible applied-voltage dependency of the capacitance value in order to prevent operation errors A capacitor in which a dielectric film is sandwiched between a diffusion region and a polysilicon electrode gives rise to a PN junction capacitance between the diffusion region and a substrate. Since this PN junction capacitance has a large voltage dependency of the capacitance value, it is difficult to realize a capacitance value which is not dependent on an applied voltage.

For a capacitor in which a dielectric film is sandwiched between top and bottom polysilicon electrodes, the polysilicon electrodes must be doped heavily to have a large impurity concentration so as to reduce the resistance and the voltage dependency coefficient of the polysilicon electrodes.

However, in accordance with simplification of manufacturing processes and scale reduction of semiconductor devices, a step of doping the polysilicon is carried out simultaneously with a doping step for forming source/drain diffusion regions of a transistor. Further, a thermal treatment time is shortened to control diffusion of impurity ions for forming the source/drain regions. As a result, the doping concentration in the polysilicon electrodes is reduced, leading to insufficient reduction of the resistance and the voltage dependency coefficient of the electrodes.

On the other hand, a capacitor in which a dielectric film is sandwiched between top and bottom metal electrodes is effective especially as analogue capacitor because the capacitance of the capacitor is not dependent on the applied voltage.

For example, Japanese Unexamined Patent Publication No. HEI 05(1993)-129522 discloses a metal/metal-capacitor structure in which a top electrode 26 is formed of aluminum, and a bottom electrode 22 is formed of a high melting point metal, as shown in FIG. 4. Also, in this publication, an electrically conductive protection film 25 is formed on a dielectric film 24 side of the top aluminum electrode 26 in order to prevent formation of hillocks of the top electrode 26 caused by a thermal treatment in the manufacturing process.

Therefore, by using such a metal/metal-capacitor structure, it is possible to realize an effective capacitor in which the applied voltage dependency is improved and further a dielectric strength is improved.

Here, even if the above-mentioned metal/metal-capacitor structure is adopted, it is necessary to form the top electrode, the bottom electrode and the interconnect layer with the same material and by the same process in order to simplify the process of manufacturing the semiconductor device.

For example, an interconnect layer to be used in an integrated circuit is typically made of a laminated film of a barrier metal and an aluminum film (See Japanese Unexamined Patent Publication No. HEI 08(1996)-274172). Here, the barrier metal is formed of a TiN/Ti layer. The Ti layer serves to obtain a good electrical connection by reducing oxides between the metals, and the TiN layer serves to strengthen the resistance to electromigration (migration of metal atoms by an electric current) of aluminum. The barrier metal serves to prevent generation of a tungsten-aluminum alloy by inhibiting direct contact between tungsten constituting a tungsten plug formed under the barrier metal and aluminum formed above the barrier metal.

However, the capacitor structure shown in FIG. 4 is formed through a series of steps including formation/patterning of a capacitor bottom electrode 22 on a semiconductor substrate 20 having a device isolation film 21, formation/opening of an interlayer dielectric film 23, and formation/patterning of an electrically conductive protection film 25 and a top electrode 26. Here, an interconnect layer is not described in the prior art shown in FIG. 4. However, if an interconnect layer is to be formed, only the top electrode 26 of the capacitor can be formed of the same material as the interconnect, because only the top electrode 26 can be formed by the same process as the interconnect layer. As a result, it is not possible to form a barrier metal with a laminated film typically used in an integrated circuit.

Also, as mentioned above, in order to form the capacitor structure shown in FIG. 4, it is necessary to separately carry out a photolithography technique for forming a bottom electrode 22 of the capacitor and a photolithography technique for forming a top electrode 26 of the capacitor, thereby complicating the manufacturing process.

SUMMARY OF THE INVENTION

The present invention provides a semiconductor device comprising a capacitor and an interconnect layer disposed on a semiconductor substrate, the capacitor being formed of a bottom electrode, a capacitor dielectric film and a top electrode, the interconnect layer being formed of a first layer and a second layer laminated on the first interconnect layer, wherein the bottom electrode and the first interconnect layer are formed of a first metal layer; the top electrode and the second layer are formed of a second metal layer; and the capacitor dielectric film is formed only on the bottom electrode.

Also, the present invention provides a method of manufacturing a semiconductor device comprising the steps of: (i)

forming a first metal layer on a semiconductor substrate, the first metal layer constituting a bottom electrode and a first layer; (ii) laminating a dielectric film on the first metal layer and patterning the dielectric film to form a capacitor dielectric film; (iii) forming a second metal layer over an entire surface of the resultant substrate to cover the capacitor dielectric film; (iv) forming a resist mask having a predetermined shape and then etching the second metal layer and the first metal layer by using the resist mask under a condition such that only the first metal layer and the second metal layer are etched, whereby a capacitor and an interconnect layer are formed simultaneously.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
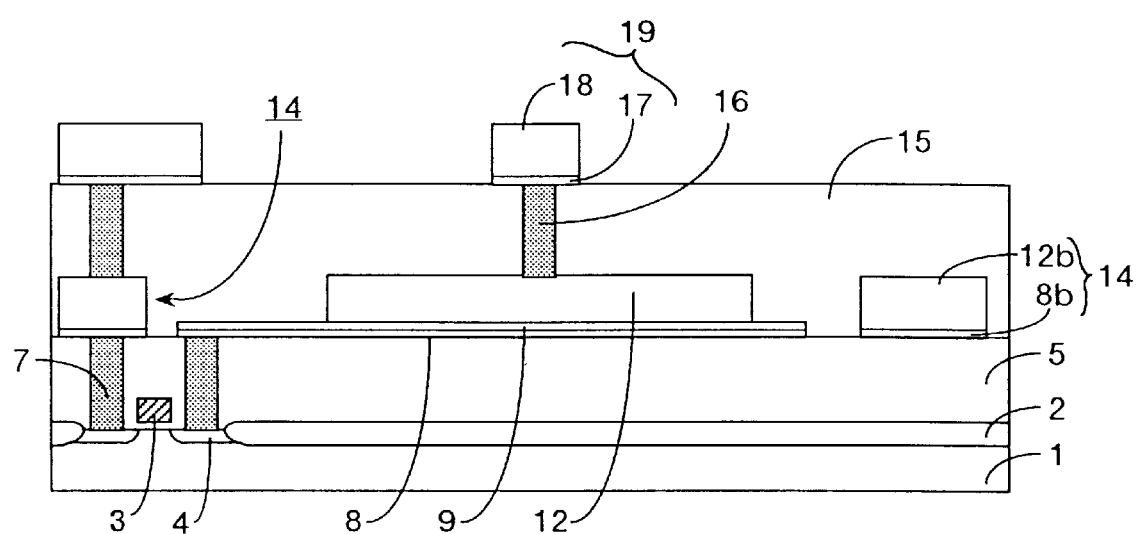
FIG. 1 is a schematic cross-sectional view showing an essential portion of an embodiment of a semiconductor device according to the present invention.

The semiconductor device of the present invention includes a capacitor and an interconnect layer formed on a semiconductor substrate. The capacitor includes a bottom electrode, a capacitor dielectric film and a top electrode. The interconnect layer is constructed with a laminated structure of second layer/first layer. In the capacitor, the capacitor dielectric film is disposed only on the bottom electrode. Here, the bottom electrode of the capacitor and the first layer are formed of a first metal layer. Also, the top electrode of the capacitor and the second layer are formed of a second metal layer.

For the semiconductor device of the present invention, the semiconductor substrate is not specifically limited as long as it is a substrate typically used in forming a semiconductor device. The material of the semiconductor substrate may be, for example, a semiconductor such as silicon or germanium, or a compound semiconductor such as GaAs or InGaAs. The semiconductor substrate may include impurity diffusion regions of first and/or second conductivity type, a device isolation film or the like in a surface of the semiconductor substrate. The semiconductor substrate may include elements such a MOS transistor, a capacitor or a resistor, an interconnect layer, a dielectric film or a combination thereof.

The bottom electrode of the capacitor is formed of a first metal layer together with the first layer constituting the interconnect layer. The material for the first metal layer is not specifically limited as long as it is formed of an electrically conductive film. The first metal layer may be typically made of a material capable of forming a barrier metal in forming the layer. The first interconnect layer may be made of a single layer of a high melting point metal such as Ti, Ta, W or Mo, or a laminated film of two or more of these metal layers. Further, the first layer may have a laminated structure of two or more layers including a nitride film or a silicide film of a high melting point metal as long as these high melting point metals are used. Specific examples of the materials for the first layer include Ti, W, Mo, TiN, TiW, WSi, MoSi, TiSi, TiN/Ti, WSi/W, MoSi/Mo, TiSi/Ti, TiW/Ti, TiW/W and the like. The thickness of the first layer is not specifically limited. However, the thickness may be, for example, about 50 nm to about 500 nm.

If the bottom electrode is to be formed of the first layer, the shape of the bottom electrode is not specifically limited and may be suitably selected in accordance with the function of the semiconductor device, the magnitude of a voltage applied to the capacitor or the like.

The capacitor dielectric film of the capacitor is formed on the bottom electrode, and its material is not specifically limited as long as it is a material typically used as a dielectric film of a capacitor. For example, the capacitor dielectric film may be formed of a dielectric film such as $SiO_2$ or $SiN$, a single layer of ferroelectric film such as PZT or PLZT, or a laminated film of two or more of these layers. The thickness of the capacitor dielectric film is not specifically limited. However, the thickness may be, for example, about 5 nm to 50 nm. Also, the shape of the capacitor dielectric film is not specifically limited. However, the shape (area) preferably has a size at least equivalent to or smaller than the bottom electrode.

The top electrode of the capacitor is formed of a second metal layer together with the second layer constituting the interconnect layer. The material of the second metal layer is not specifically limited as long as it is formed of an electrically conductive film. However, the second metal layer is preferably made of an aluminum-based metal. Specifically, the second metal film may be made of a single layer of aluminum, AlCu, AlSi, AlCuSi or the like, or a laminated film of two or more of these layers. The thickness of the second layer is not specifically limited. However, the thickness may be, for example, about 50 nm to 1500 nm.

If the top electrode is to be formed of the second layer, the shape of the top electrode is not specifically limited and may be suitably selected in accordance with the function of the semiconductor device, the magnitude of a voltage applied to the capacitor or the like. However, the top electrode preferably has a width (area) smaller than the width (area) of the bottom electrode, for example, by about 1 $\mu$m (width) because of the following reasons. In the case where the size (area) of the top electrode is equal to the size (area) of the bottom electrode, the bottom electrode material adheres to a side wall of the capacitor dielectric film at the time of etching these electrode layers, thereby causing a short circuit between the top electrode and the bottom electrode of the capacitor. Also, if the width of the top electrode is smaller than the width (area) of the bottom electrode, an alignment margin can be ensured in a photolithography technique.

The interconnect layer in the semiconductor device of the present invention comprises the first layer and the second layer formed thereon. The materials and the thicknesses of the first layer and the second layer are as mentioned above.

Also, according to the method for manufacturing a semiconductor device of the present invention, in the step (i), a first metal layer is formed on a semiconductor substrate. The method for forming the first metal layer may vary depending on the materials to be used. However, if the first metal layer is to be made of a single layer of a high melting point metal or a laminated film of two or more of these layers, it may be possible to perform the sputtering method using a high melting point metal target or the CVD method. If the first metal layer is to be formed of a laminated structure including two or more layers of a high melting point metal and a nitride or silicide film of a high melting point metal such as TiN/Ti, it may be possible to perform the sputter method or the CVD method.

In the step (ii), a dielectric film is laminated on the first metal layer. Here, the dielectric film is formed almost over the entire surface of the first metal layer. The method of forming the dielectric film may vary depending on the materials to be used. However, the method may be, for example, the CVD method using a silane gas and optionally a nitrogen gas, the MOCVD method or the sol-gel method.

Subsequently, the dielectric film thus formed is patterned to form a capacitor dielectric film. The patterning in this step is carried out under a condition such that only the dielectric film is etched with little etching of the first metal layer located thereunder. The patterning may be carried out by forming a resist pattern having a desired shape by a photolithography and etching technique, and then performing the dry etching using $CF_4$, $CHF_3$ or the like, or performing the wet etching using hydrofluoric acid, phosphoric acid or the like.

In the step (iii), a second metal layer is formed over the entire surface of the resultant substrate so as to cover the capacitor dielectric film almost completely. The method for forming the second metal layer may vary depending on the material to be used. However, it may be possible to perform the sputtering method using aluminum or aluminum-based metal target or the CVD method.

In the step (iv), a resist mask having a predetermined shape is formed first. The resist mask in this step may be formed by performing a known photolithography and etching technique. The resist mask preferably has a shape such that regions for forming the top electrode and the second layer are covered with the resist mask.

Further, the second metal layer and the first metal layer are etched by using the above-mentioned resist mask. Here, it is necessary to select an etching condition such that only the first metal layer and the second metal layer are etched with little etching of the capacitor dielectric film. In other words, the etching condition may be, for example, such that the etching rate ratio of the first metal layer and the second metal layer to the capacitor dielectric film is about 10:1 to about 20:1.

In the present invention, the capacitor and the interconnect layer can be formed of the same material simultaneously through the above steps (i) to (iv). Also, a semiconductor device having a multi-layer structure with two or more layers may be formed by repeating the above steps.

Hereafter, embodiments of the semiconductor device of the present invention and the method for manufacturing the same will be explained with reference to the attached drawings.

EXAMPLE 1

FIG. 1 shows a semiconductor device according to this embodiment.

The semiconductor device includes a MOS transistor formed on a silicon substrate 1 in which a device isolation film 2 is formed. The MOS transistor includes a gate dielectric film, a gate electrode 3, and source/drain regions 4. An interlayer dielectric film 5 is formed on the MOS transistor. Further, a contact hole is formed in the interlayer dielectric film 5 above the source/drain regions 4. A tungsten plug 7 is buried in the contact hole. Further, a capacitor is formed on the contact plug 7. The capacitor includes a bottom electrode 8, a capacitor dielectric film 9 and a top electrode 12 which are successively laminated on the contact plug 7. The bottom electrode 8 has a two-layer structure of TiN/Ti which is a first metal layer. The capacitor dielectric film 9 is made of $SiO_2$. The top electrode 12 is made of aluminum which is a second metal layer. The top electrode 12 has a width (area) smaller than the widths of the bottom electrode 8 and the capacitor dielectric film 9. An interconnect layer 14 is formed on another contact plug 7. The interconnect layer 14 has a laminated structure including a first layer 8b formed of the first metal layer and a second layer 12b formed of the second metal layer.

Further, an interconnect layer 19 is formed on the capacitor and the interconnect layer 14 via an interlayer dielectric film 15 and a tungsten plug 16. The interconnect layer 19 has a laminated structure including a first layer 17 formed of the first metal layer and a second layer 18 formed of the second metal layer.

Such a semiconductor device may be manufactured by the following method.

Figure 2:
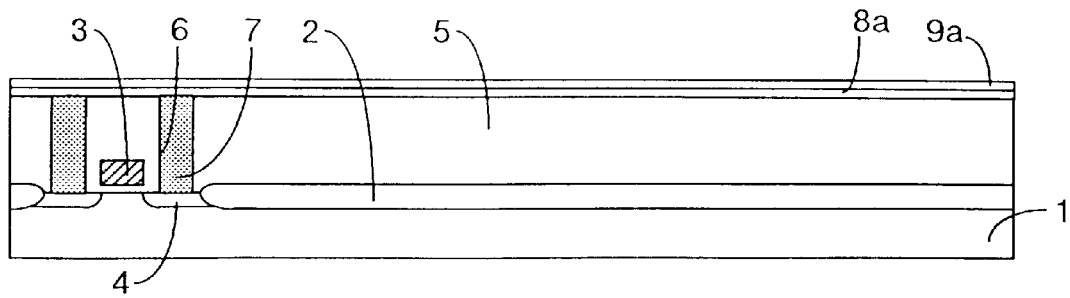
FIG. 2 is a schematic cross-sectional view of the essential portion showing steps for manufacturing the semiconductor device according to the present invention.
Figure 2:
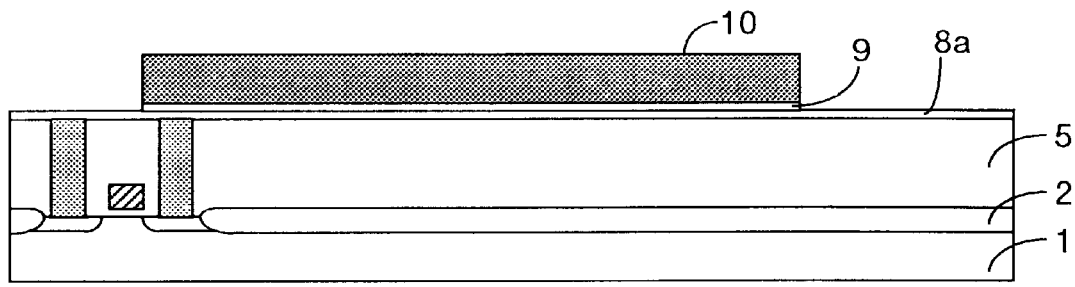
Figure 2:
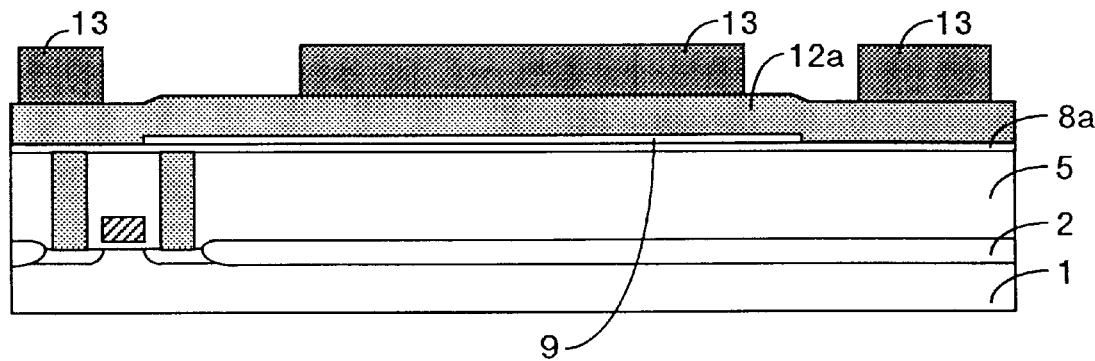
Figure 2:
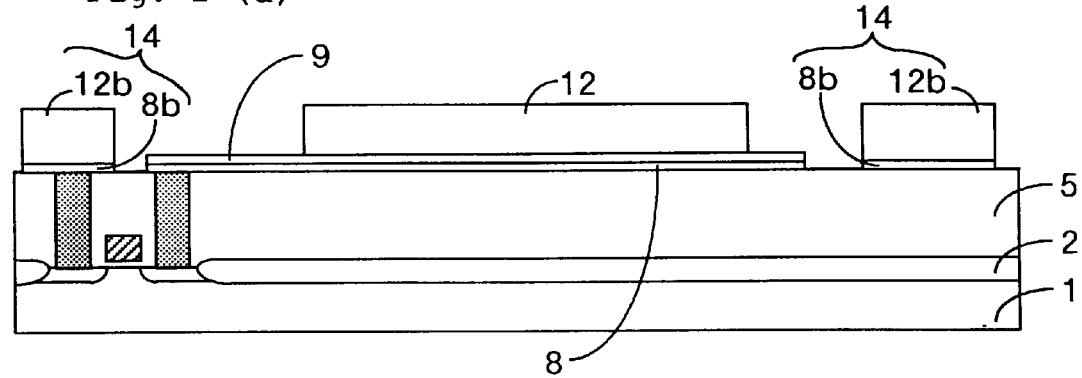

First, referring to FIG. 2(a), a device isolation film 2 is formed to have a thickness of about 300 to 500 nm on a silicon substrate 1 by the LOCOS method so as to define an active region. On the active region is formed a MOS transistor including a gate dielectric film, a gate electrode 3 and source/drain regions 4. An interlayer dielectric film 5 is formed to have a thickness of about 700 to 1000 nm over the entire surface of the MOS transistor by the CVD method and the surface of the interlayer dielectric film 5 is planarized by CMP. Then, a contact hole 6 is formed in the interlayer dielectric film 5 on the source/drain regions 4 by a photolithography and etching technique for enabling an electric contact to the source/drain regions 4. Subsequently, a tungsten plug 7 is buried in the contact hole 6. In this Example, the tungsten plug 7 is directly buried in the contact hole 6. However, the tungsten plug 7 may be buried after the inside surface of the contact hole 6 is covered with TiN/Ti film.

Then, a first metal layer 8a of a high melting point metal is formed over the entire surface of the interlayer dielectric film 5 including a portion on the contact hole 6 by the sputtering method. The first metal layer 8a will be formed into a bottom electrode of a capacitor and a first layer of an interconnect layer. Here, the first metal layer 8a is formed to have a two-layer structure of TiN/Ti in an order of Ti to TiN from the silicon substrate 1. The TiN/Ti layer is formed to have a thickness of TiN/Ti=70 to 130 nm/40 to 80 nm so as to ensure uniformity.

Here, the TiN/Ti layer serves as a barrier metal, where the Ti layer may achieve good electric connection by reduction of oxides between metals, and the TiN layer may increase the resistance to electromigration of aluminum. Also, the TiN/Ti layer prevents direct contact between the metal tungsten constituting the tungsten plug 7 and the metal aluminum constituting a later-mentioned second metal layer, so as to prevent generation of an alloy of tungsten and aluminum.

Then, a dielectric film 9a, which will be a capacitor dielectric film 9 of the capacitor, is formed over the entire surface of the first metal layer 8a by the TEOS plasma CVD method (approximately 400° C.) so that the thickness of the dielectric film is about 23 nm if an intended capacitance value per unit area is $1.5 \times 10^{-15}$ $F/\mu m^2$.

Subsequently, referring to FIG. 2(b), a resist pattern 10 having a desired shape is formed on the dielectric film 9a. A capacitor dielectric film 9 of the capacitor is formed by etching the dielectric film 9a using the resist pattern 10 as a mask. In this step, a mixture gas of $CF_4$ and $CHF_3$ is used as an etching gas.

Then, referring to FIG. 2(c), a second metal layer 12a of aluminum is formed to have a thickness of 400 to 600 nm over the entire surface of the first metal layer 8a by the sputter method so as to cover the capacitor dielectric film 9. The second metal layer 12a will be patterned into a top electrode of the capacitor and a second layer 12b of the interconnect layer in a later step. Thereafter, a resist pattern 13 having a desired shape is formed on the second metal layer 12a.

Next, referring to FIG. 2(d), the second metal layer 12a and the first metal layer 8a are etched by using the resist pattern 13 as a mask under a condition such that only the second metal layer 12a and the first metal layer 8a are etched. Through this etching, the top electrode 12 of the capacitor and the second layer 12b of the interconnect layer are patterned at the same time, and also the bottom electrode 8 of the capacitor and the first layer 8b of the interconnect layer are patterned at the same time. This may form the capacitor and the interconnect layer 14 at the same time. Here, the etching condition in this etching step was such that the power was 400 W and the pressure was 80 to 120 mTorr using a mixed gas (1:1) of $BCl_3$ and $Cl_2$. In this etching step, the capacitor dielectric film 9 is etched only a little because the etching rate ratio of the second metal layer 12a of aluminum to the capacitor dielectric film 9 of $SiO_2$ under this condition is 10:1. Therefore, the capacitor dielectric film 9 may be used as a mask of the bottom electrode 8 of the capacitor located thereunder. In addition, the width of the top electrode was set to be about 49 $\mu$m, which is smaller than the width of the bottom electrode (about 50 $\mu$m).

Further, an interlayer dielectric film 15 is formed to have a thickness of 700 to 1000 nm over the entire surface by the TEOS plasma CVD method, as shown in FIG. 1, and the surface of the interlayer dielectric film 5 is planarized by CMP. Then, a contact hole is formed in the interlayer dielectric film 15 on the top electrode 12 of the capacitor and on the second layer 12b by a photolithography and etching technique. Next, a tungsten plug 16 is buried in the contact hole. Thereafter, an interconnect layer 19 including a first layer 17 and a second layer 18 is formed.

EXAMPLE 2

Figure 3:
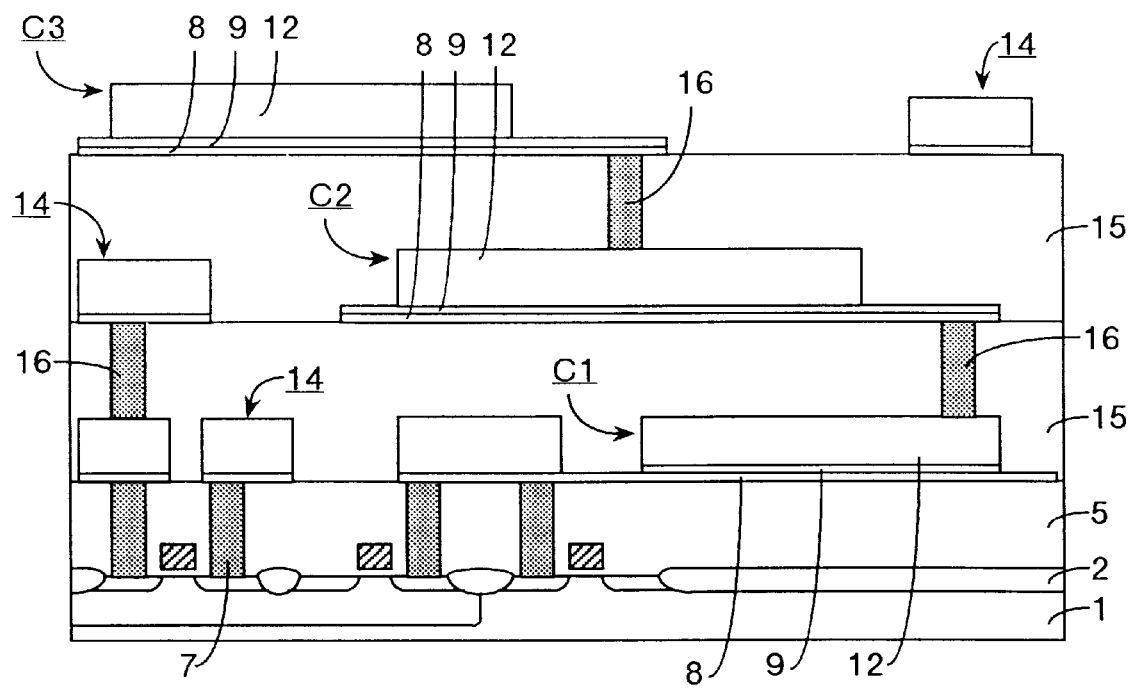
FIG. 3 is a schematic cross-sectional view showing an essential portion of another embodiment of a semiconductor device according to the present invention.
Figure 4:
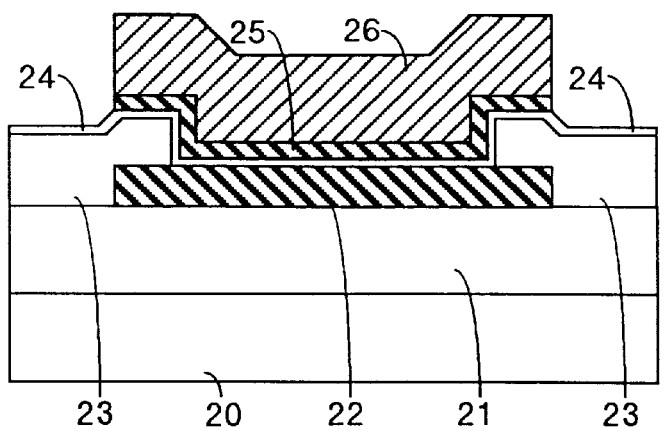
FIG. 4 is a schematic cross-sectional view showing an essential portion of a conventional semiconductor device.

A semiconductor device according to this embodiment is shown in FIG. 3.

The semiconductor device in this Example has substantially the same structure as the semiconductor device of the Example 1 having a two-layer interconnect layer structure except that the semiconductor device of this Example has a three-layer interconnect layer structure in which capacitors and interconnect layers are formed in three layers from C1 to C3.

Also, the semiconductor shown in FIG. 3 may be manufactured by repeating substantially the same process as that of the Example 1.

According to the semiconductor device of the present invention, the bottom electrode of the capacitor and the first layer of the interconnect layer are formed of one material (the first metal layer), and the top electrode of the capacitor and the second layer of the interconnect layer are formed of another one material (the second metal layer), thereby providing a less expensive semiconductor device. In addition, if a high melting point metal is particularly used as the first metal layer, a film serving as a barrier metal in the interconnect layer can be formed as the first layer, so that it is possible to prevent an unfavorable reaction caused by direct contact of the contact plug under the first layer and the metal of the top layer of the first layer in the interconnect layer portion, thereby realizing a more reliable interconnect layer.

Further, if the top electrode of the capacitor is formed to occupy a smaller width (area) than the bottom electrode, a short circuit between the top electrode and the bottom electrode of the capacitor can be prevented, and an alignment margin can be ensured in the later-performed photolithography step.

In addition, according to the method of manufacturing a semiconductor device of the present invention, the bottom electrode of the capacitor and the first layer of the interconnect layer can be formed of the same material and patterned at the same time, and the top electrode of the capacitor and the second layer of the interconnect layer can be formed of the same material and patterned at the same time, thereby eliminating the need for performing an additional special step in forming both the capacitor and the interconnect layer. This leads to a more simplified manufacturing process. Therefore, a more reliable semiconductor device can be manufactured with lower production costs.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What I claim is:

1. A semiconductor device comprising a capacitor and an interconnect layer disposed on a semiconductor substrate, the capacitor being formed of a bottom electrode, a capacitor dielectric film and a top electrode, the interconnect layer being formed of a first layer and a second layer laminated on the first layer, wherein the bottom electrode and the first layer are formed of a first metal layer; the top electrode and the second layer are formed of a second metal layer; the capacitor dielectric film is formed only on the bottom electrode; and the first layer and the second layer are in the same shape.

2. The semiconductor device of claim 1, wherein the first metal layer is formed of a high melting point metal, and the second metal layer is formed of an aluminum-based metal.

3. The semiconductor device of claim 1, wherein the top electrode is formed to occupy a smaller area than the bottom electrode.

4. The semiconductor device of claim 1, wherein the top electrode is formed to occupy a smaller area than the capacitor dielectric film.

5. The semiconductor device of claim 1, wherein the first metal layer is formed of a barrier metal.

6. The semiconductor device of claim 5, wherein first metal layer is formed of a high melting point metal.

7. The semiconductor device of claim 1, wherein the first metal layer is formed of a barrier metal, and the second metal layer is formed of an aluminum-based metal.

8. The semiconductor device of claim 7, wherein the first metal layer is formed of a high melting point metal.

9. The semiconductor device of claim 1, wherein the second metal layer is formed of an aluminum-based metal.

10. A semiconductor device, comprising:

a semiconductor substrate;

a first capacitor formed on the semiconductor substrate and comprising bottom and top electrodes insulated by a capacitor dielectric film; and a first interconnect layer formed on the semiconductor substrate and comprising a first layer and a second layer laminated directly on the first layer, wherein the bottom electrode of the first capacitor and the first layer of the first interconnect layer are formed from the same layer of a first metal; the top electrode of the first capacitor and the second layer of the first interconnect layer are formed from the same layer of a second metal; and the first and second layers of the first interconnect layer are patterned in the same shape.

11. The semiconductor device of claim 10, wherein the layer of a first metal is a high melting point metal layer, and the layer of a second metal is an aluminum-based metal layer.

12. The semiconductor device of claim 10, wherein the top electrode of the capacitor is smaller in area than the area of the bottom electrode of the capacitor.

13. The semiconductor device of claim 10, wherein the top electrode of the capacitor is smaller in area than the area of the capacitor dielectric film.

14. The semiconductor device of claim 10, further comprising:

a first interlayer insulating layer formed over the first capacitor and the first interconnect layer;

a second capacitor and a second interconnect layer formed on the first interlayer insulating layer.

15. The semiconductor device of claim 14, wherein a bottom electrode of the second capacitor and a first layer of the second interconnect layer are formed from the same layer of a third metal; a top electrode of the second capacitor and a second layer of the second interconnect layer are formed from the same layer of a fourth metal; and the first and second layers of the second interconnect layer are patterned in the same shape.

16. The semiconductor device of claim 14, further comprising:

a second interlayer insulating layer formed over the second capacitor and the second interconnect layer;

a third capacitor and a third interconnect layer formed on the second interlayer insulating layer.

\* \* \* \* \*